United States Patent
Jaksch et al.

(10) Patent No.: US 10,451,750 B2
(45) Date of Patent: Oct. 22, 2019

(54) SCINTILLATION DETECTOR WITH A HIGH COUNT RATE

(71) Applicants: INTEGRATED DETECTOR ELECTRONICS AS, Oslo (NO); FORSCHUNGSZENTRUM JÜLICH GMBH, Jülich (DE)

(72) Inventors: Sebastian Jaksch, Neufahrn bei Freising (DE); Henrich Frielinghaus, Neufahrn (DE); Ralf Engels, Hürtgenwald (DE); Günter Kemmerling, Linnich-Tetz (DE); Kalliopi Kanaki, Malmo (SE); Richard Hall-Wilton, Malmo (SE); Sylvain Désert, Bretigny-sur-Orge (FR); Codin Gheorghe, Slependen (NO)

(73) Assignees: Forschungszentrum Jülich GmbH (DE); Commissariat á l'Energie Atomique et aux Energies (CEA) (FR); Integrated Detector Electronics AS (NO); Legal Division European Spallation Source ERIC (SE)

(*) Notice: Subject to any disclaimer, the term of this patent is extended or adjusted under 35 U.S.C. 154(b) by 14 days.

(21) Appl. No.: 15/531,247

(22) PCT Filed: Oct. 20, 2015

(86) PCT No.: PCT/EP2015/074200
§ 371 (c)(1),
(2) Date: May 26, 2017

(87) PCT Pub. No.: WO2016/083021
PCT Pub. Date: Jun. 2, 2016

(65) Prior Publication Data
US 2017/0329027 A1    Nov. 16, 2017

(30) Foreign Application Priority Data
Nov. 28, 2014   (DE) .................. 10 2014 224 449

(51) Int. Cl.
*G01T 3/06*        (2006.01)
*G01T 1/20*        (2006.01)
(Continued)

(52) U.S. Cl.
CPC .............. *G01T 3/06* (2013.01); *G01T 1/2018* (2013.01); *G01T 1/1644* (2013.01); *G01T 1/20* (2013.01);
(Continued)

(58) Field of Classification Search
CPC ... G01T 1/1644; G01T 1/2018; G01T 1/2002; G01T 1/2006; G01T 1/20; G01T 3/06; H01L 27/14663; H01L 31/0232
(Continued)

(56) References Cited

U.S. PATENT DOCUMENTS 4,870,279 A * 9/1989 Cueman ............... G01T 1/2018
                                              250/368
5,596,198 A * 1/1997 Perez-Mendez ...... G01T 1/1642
                                              250/363.02
(Continued)

FOREIGN PATENT DOCUMENTS

JP     2003183637 A     7/2003
JP     2008209124 A     9/2008
(Continued)

OTHER PUBLICATIONS

Yoshikawa A et al.; Positron emission mammography using Pr:LuAG scintillator—Fusion of optical material study and systems engineering, Optical Materials, Aug. 1, 2010, pp. 1294-1297, vol. 32, No. 10, Elsevier Science Publishers B.V. Amsterdam, NL.
(Continued)

*Primary Examiner* — Taeho Jo
(74) *Attorney, Agent, or Firm* — Barnes & Thornburg LLP

(57) ABSTRACT

The invention concerns a scintillation detector with which high count rates and/or high resolutions are possible. The
(Continued)

Figure 1:
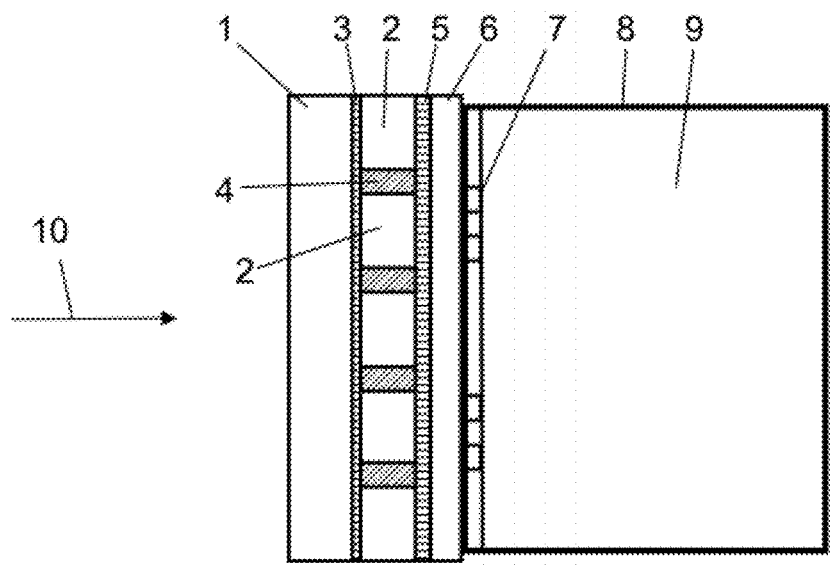

scintillator of the claimed scintillation detector is formed from pixels (2), which are separated from each other by interstices (4). Alternatively or additionally, the surface of the scintillator is divided by grooves into pixels (2). Such a structure enables not only a particularly high resolution. When multiple detector modules are used, it also allows high count rates in the range of roughly 20 MHz.

13 Claims, 2 Drawing Sheets

(51) Int. Cl.
  G01T 1/164 (2006.01)
  H01L 27/146 (2006.01)
(52) U.S. Cl.
  CPC .......... G01T 1/2002 (2013.01); G01T 1/2006 (2013.01); H01L 27/14663 (2013.01)
(58) Field of Classification Search
  USPC .................................................. 250/390.11
  See application file for complete search history.

(56) References Cited

U.S. PATENT DOCUMENTS

| | | | | |
|---|---|---|---|---|
| 6,660,532 B1* | 12/2003 | Lopez | ................... | B82Y 30/00 204/193 |
| 7,372,041 B1* | 5/2008 | Nagarkar | ................... | G01T 3/06 250/390.11 |
| 8,017,916 B1* | 9/2011 | Majewski | ................ | G01T 1/1648 250/366 |
| 8,809,794 B2* | 8/2014 | Uchida | ................. | G01T 1/2006 250/361 R |
| 2002/0027200 A1 | 3/2002 | Homme et al. | | |
| 2002/0131547 A1* | 9/2002 | Riedner | ................. | G01T 1/202 378/19 |
| 2002/0181647 A1* | 12/2002 | Venkataramani | ..... | G01T 1/2018 378/19 |
| 2004/0061042 A1* | 4/2004 | Almogy | ............. | G01N 21/8806 250/208.1 |
| 2006/0192129 A1* | 8/2006 | Yun | ........................... | G01T 1/20 250/370.11 |
| 2007/0045554 A1* | 3/2007 | Wakamatsu | .......... | G01T 1/2018 250/370.11 |
| 2007/0280409 A1* | 12/2007 | Konno | ................... | A61B 6/032 378/19 |
| 2008/0103391 A1* | 5/2008 | Dos Santos Varela | ...................... | G01T 1/1615 600/436 |
| 2009/0014662 A1* | 1/2009 | Suhami | .................... | G01T 3/06 250/390.11 |
| 2009/0101844 A1* | 4/2009 | Ohbayashi | ................ | G01T 1/20 250/488.1 |
| 2009/0236534 A1* | 9/2009 | Selfe | ...................... | G01T 1/2018 250/370.11 |
| 2010/0032578 A1* | 2/2010 | Levene | ................. | G01T 1/1644 250/370.11 |
| 2010/0074399 A1* | 3/2010 | Majewski | ................. | G01T 1/00 378/37 |
| 2010/0294940 A1* | 11/2010 | Wieczorek | ........... | G01T 1/2018 250/363.03 |
| 2011/0108733 A1* | 5/2011 | Menge | .................. | G01T 1/2018 250/370.08 |
| 2012/0181437 A1* | 7/2012 | Nelson | ................. | A61B 6/4216 250/366 |
| 2013/0299707 A1* | 11/2013 | Levin | ...................... | G01T 1/164 250/363.03 |
| 2014/0030832 A1* | 1/2014 | Selfe | ...................... | G01T 1/2018 438/29 |
| 2014/0091235 A1* | 4/2014 | Iguchi | ....................... | G01T 1/20 250/487.1 |
| 2014/0367553 A1* | 12/2014 | Selfe | ........................ | G01T 1/20 250/208.1 |
| 2015/0028218 A1* | 1/2015 | Kataoka | ................ | G01T 1/1644 250/367 |
| 2015/0307777 A1* | 10/2015 | Fukuda | ..................... | G01T 3/06 250/390.11 |
| 2015/0309189 A1* | 10/2015 | Hamano | ............... | G01T 1/2018 250/486.1 |
| 2016/0097864 A1* | 4/2016 | Vora | ...................... | G01T 1/2018 257/428 |
| 2016/0202363 A1* | 7/2016 | Fukuda | ..................... | G01T 3/06 250/367 |
| 2016/0259070 A1* | 9/2016 | Fukuda | ..................... | G01T 3/06 |

FOREIGN PATENT DOCUMENTS

| | | |
|---|---|---|
| JP | 2008232782 A | 10/2008 |
| WO | 2011115179 A1 | 9/2011 |

OTHER PUBLICATIONS

Nakamouri, T. et al., Development of a gamma-ray imager using a large area monolithic 4×4 MPPC array for a future PET scanner, Journal of Instrumentation, Jan. 24, 2012, 14 pages, vol. 7 No. 1, Institute of Physics Publishing, Bristol, GB.

Yanagida, Takayuki et al., Basic study of single crystal fibers of Pr:Lu3Al5O12 scintillator for gamma-ray imaging applications, Science Direct, Oct. 1, 2011, pp. 256-259, vol. 652, No. 1, Nuclear Instruments & Methods in Physics Research, Section A: Accelerators, Spectrometers, Detectors and Associated Equipment.

English Translation of PCT International Search Report, PCT/EP2015/074200, dated Apr. 6, 2016, 4 pages.

Akira Yoshikawa et al., Positron emission mammography using Pr:LuAG scintillator—Fusion of optical material study and systems engineering, Optical Materials, Aug. 2010, pp. 1294-1297, vol. 32, Issue 10.

* cited by examiner

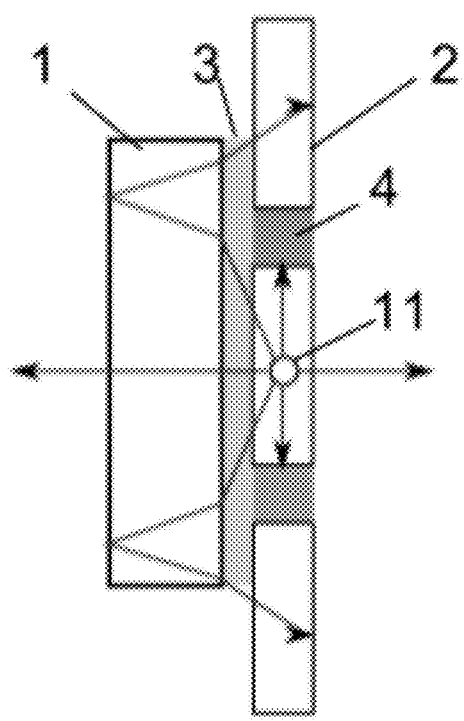
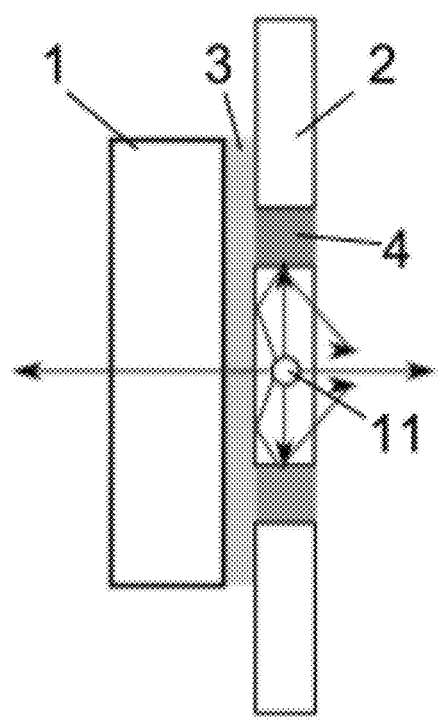
FIG. 3
FIG. 4

SCINTILLATION DETECTOR WITH A HIGH COUNT RATE

CROSS-REFERENCE TO RELATED APPLICATIONS

This application is a national stage entry under 35 USC § 371 of PCT International Application Number PCT/EP2015/074200, filed 20 Oct. 2015, which claims priority to German Patent Application Number 102014224449.8, filed 28 Nov. 2014, the entire disclosures of each of which is expressly incorporated by reference herein.

The invention concerns a scintillation detector in particular for neutrons.

A scintillation detector is a measuring device based on scintillation for determination of energy, intensity as well as position of ionizing radiation. In the scintillator of a scintillation detector, light flashes are generated by means of incident ionizing radiation, whose number depends on the energy of the incident radiation. These very weak light flashes release electrons from a photocathode of a photomultiplier that is arranged behind. These electrons are multiplied through hitting at the electrodes in the photomultiplier. At the anode, a current pulse may then be taken, whose amplitude depends on the energy of the incident radiation. Instead of a photomultiplier, a photodiode may also be applied.

A scintillation detector may be used for the measurement of alpha, beta, gamma or neutron radiation, specifically depending on the scintillator. Suitable as scintillator are for example thallium-doped sodium iodide, Lanthanum chloride or cesium iodide. A scintillation detector for neutrons having a scintillator, which contains $^6$Li, is known from the document EP 2631676 A1.

A scintillation detector for neutrons having a scintillation surface that is one square meter large is presently limited to a count rate of at least 100 kHz up to roughly 1 MHz. Furthermore, the reachable resolution, minimum up to 8 mm in every direction, leads to a high calculation effort during the measurement, because this resolution is only possible though interpolation according to the Anger principle. The maintenance and repair of such a scintillation detector are comparatively expensive. Reachable geometries are comparatively limited. In the area of a primary beam, scintillation detectors have to be protected by a shielding.

Alternatively, gas detectors for the detection of neutrons may be used. Count rates of 1 to 1.5 MHz are reliably reachable. As gas, $^3$He is often applied, which however is increasingly limited available.

It is object of the invention to establish a scintillation detector with which high count rates as well as high resolutions are possible.

A scintillation detector comprises for solving the problem the features of claim 1. Advantageous embodiments result from the dependent claims.

The scintillator of the scintillation detector according to the invention is formed from several pixels, which are separated from each other by interstices. Alternatively or additionally, the surface of the scintillator is divided by grooves into pixels. Such a structure enables not only a particularly high resolution. When multiple detector modules are used, it also allows high count rates in the range of several 20 MHz.

The grooves and/or the interstices between the individual scintillator pixels are preferably filled with reflection material for the light to be detected, in order to allow through the thereby achieved optical separation of the individual pixels to solving the problem of the invention in a further improved manner. A cross-talk may thereby be advantageously avoided. Barium sulfate may for example serve as reflection material, in order to solve the problem of the invention in an improved manner. For example by means of a binder, the reflection material may be attached.

Instead of a reflection material, an absorbing material may be used for the light to be detected in order to avoid a cross-talk. However, a reflector enables a higher sensitivity and is thus to be preferred.

Pixel sizes can be realized, which are up to 8 mm, preferably up to 6 mm, further preferred up to 3 mm long and/or up to 8 mm, preferably 6 mm, further preferred up to 3 mm wide. The same correspondingly applies for the pixelation of the scintillation or converter materials by means of grooves.

The pixels of the scintillator contain preferably $^6$Li in order to allow suitable production and neutrons detection. Alternatively, $^{10}$B or another neutron converter may be provided. Different scintillation materials are possible. Furthermore, between different established materials may be chosen.

In order to allow readout in a space-resolved manner and with higher count rate, a multi-anode photomultiplier has proven to be suitable. The multi-anode photomultiplier converts light flashes generated by the scintillator into electric signals. A multi-anode photomultiplier may also be replaced by an adequate light detection unit, though.

The size of a pixel of the scintillator advantageously corresponds to the size of a subsequently arranged anode of the photo sensitive surface, here photomultiplier. The same correspondingly applies also for other light readout units. Hereby, it is achieved that the light flashes, which are generated in a pixel, get almost completely to an opposite anode of the here described photomultiplier or a corresponding light readout unit, respectively, in order to thus allow detecting with high count rate and high space-resolution. The pixels of the light readout unit are therefore in one embodiment up to 8 mm, preferably 6 mm, further preferred up to 3 mm, long and/or up to 8 mm, preferably up to 6 mm, further preferred up to 3 mm, wide.

The pixels of the light readout unit are preferably at least 3 mm long and/or at least 3 mm wide, so that no excessively high technical production expenditures have to be accomplished.

The scintillation detector is formed in one embodiment from a multiplicity of modules. Each module comprises an own scintillator, an own light readout unit and an own readout electronics. An exchange of individual modules is possible and minimizes the maintenance effort and the repairing effort. An individual module has advantageously a base surface of not more than 52×52 mm$^2$.

Further advantages and embodiments, which enable a further improved count rate and/or high space-resolution result from the following description.

The scintillation detector comprises besides a light readout unit for converting the light into electric signals an amplification and digitalization of the signals of the readout unit though integrated electronic components and a fast programmable logic device for time-resolved registration of logic pulses, which corresponds to neutrons.

For example, $^6$Li containing scintillator pixels are transparent. For example, glass is used, which is doped with $^6$Li and which is called Li-glass in the following.

During neutron capture, blue light may be emitted and an absorption coefficient of ca. 98% at a neutron wavelength of 5 Å is possible.

A multi-anode photomultiplier has for example in its embodiment an active surface for light detection of ca. 89% relatively to the entire surface facing the scintillator, which is produced over individual anode pixels of the size 5.8×5.8 mm² with a distance of 6.08/6.26 mm (inside/outside) or 2.8×2.8 mm² with a distance of 3.04/3.22 (inside/outside), respectively. The same correspondingly applies also for other light readout units.

Integrated electronic components conduct an amplifying and noise filtering of the individual signals of the light readout.

The integrated electronic components comprise in one embodiment a comparator for the individual signals, which through an adjustable threshold generates a logic output signal.

The integrated electronic components advantageously comprise an analog-to-digital converter, with which the generated charge quantity of the anode signal may be measured.

A programmable logic device is advantageously provided, which allows setting (adjusting) of the measurement modes and of the comparator thresholds of integrated electronic components.

The programmable logic device may advantageously register the logic signals of the integrated electronic components and sum them up in a chronological order in internal storages (memories).

The programmable logic device may advantageously register the data of the analog-to-digital converters and sum them up in internal storages (memories) for every channel corresponding to the size.

The programmable logic device includes advantageously an outer interface for access to or respectively transportation of the data registered in internal storages (memories).

The detector thus particularly comprises a programmable logic device with internal storage areas (memory areas) in the downstream electronics, which takes over a variety of tasks. It conducts the setting of the measurement modes and of the comparator thresholds of integrated electronic components and registers the logic comparator signals, which are summed up chronologically in internal storage places, as well as also the data of the analog-to-digital converter, which are also summed up in internal storages for every channel corresponding to the size. Additionally, it has an outer interface for access to or respectively transport of the data registered in the internal storages, such that they may be displayed by a computer with screen and analyzed and/or written in a file for later evaluation.

Thereby, a modular and scalable multi-channel detector for thermal neutrons is described, which distinguishes neutrons and gamma radiation by setting a comparator threshold to the height of the generated signals.

In particular, special light readout units such as for example multi-anode photomultiplier (for example commercially available under the name H8500, H9500) may be used, which have, in an extremely dense packaging, many individual light detection channels with a small surface and an almost borderless connection (crossover) to neighboring channels. Thereby, a relatively high resolution as well as also a high active surface for light detection is realized, which would not be reachable with single-channel photomultipliers. The high active surface for the light detection is in particular of advantage, because it significantly determines the detected amount of light and thus the important distinction between neutrons and gamma radiation. The active surface is then only bordered by the for example 1.5 mm wide outer border of the preferably applied multi-anode photomultiplier, so that the amount of the active surface amounts to 89% measured by the total surface.

At the detector, these properties of the multi-anode photomultiplier are used in one corresponding embodiment in order to apply the individual channels as separate detectors for thermic neutrons. The thereby reached resolution of for example 6 mm or 3 mm, respectively, is suitable for many applications in the neutron scattering. As evidence material, mostly $^6Li$ containing scintillator pixels are used, which generate light during neutron capture with a very low decay time (for example $^6Li$ glass). The size of this scintillator pixel is dimensioned such way that it covers by area almost one channel of the multi-anode photomultiplier. Only a small interstice is kept between neighboring pixels, which is filled with optical reflection material. Thereby, a disturbing cross-talk of the generated light to neighboring channels may be as far as possible avoided, so that only the hit channel generates a substantial electrical signal. At a sandwich manufacturing from scintillation material and substrate material, wherein only the scintillation material is pixelated by grooves, a cross-talk should be furthermore suppressed by reflection in the substrate material. This is achieved either by a low index of refraction of the substrate material and thereby generated inner total reflection or a reflecting adhesive or absorbing layer. Also a combination of both measures is possible.

The processing of the electric signals may be realized separately and comparatively simple with the aim of distinguishing between neutrons and gamma radiation based on the height of the signal. As a first step, an amplification and noise filtering of the very small electric signal is suitable in order to improve the precision during the pulse height determination. Thereafter, the signal is supplied to a comparator, at which the distinction between neutrons and gamma radiation is carried out by means of an adjustable threshold. In the case of a neutron as result, the comparator generates a logic pulse. For setting the comparator threshold, an analog-to-digital converter is used, by which the generated pulse height can be measured. When providing a numerical illustration of the pulse heights in a histogram, the value of the needed threshold is visible. Because the analog-to-digital converter is used only for setting purpose, a solution for the detector by means of multiplexing the channels for converting may be used.

In order to ensure in one embodiment a modularity and scalability of the detector, the (when setup according to the specified normal operations horizontal and vertical) extension of the signal processing, thus the base surface, does not exceed the size of the front surface of the light readout unit, for example multi-anode photomultiplier. Therefore, a compact solution is applied via integrated electronic components. A single module then includes for example a base surface of 52×52 mm². A scintillation detector may then comprise a multiplicity of such modules. The maintenance effort can thereby be kept low. In case of repair, a defect module can also be exchanged very easily. Module is here understood as a unit, which can be used as scintillation detector, specifically in combination with further modules as well as also independent from further modules.

The reachable count rates with this detector are limited substantially by the decay time of the scintillator, the response time, thus the answer time, the light readout unit such as for example the maximal anode current of the multi-anode photomultiplier and the time constant at the amplifying and noise filtering of the electrical signal. The maximal anode current is fixedly predefined by the special multi-anode photomultiplier, but by means of a suitable choice of the scintillator and the therewith related time constant at the signal processing and in particular also by means of the high segmentation of the detector described herein, very high count rates, by area (related to the area), can be reached. The active area for neutrons detection may be determined though the border of the light readout unit, here: multi-anode photomultiplier, and the interstices of the scintillator pixels. A portion of the active detection surface for neutrons of ca. 85% of the total surface results thereof, which allows, in conjunction with the absorption of the scintillator, a detection efficiency (evidence efficiency) of more than 80% for thermic neutrons at 5 Å. At the same time, the modular structure of the detector allows the use in a scalable arrangement for big surfaces, wherein the properties scales in the same manner with the surface.

The following advantages can thus be realized by means of the detector according to the invention.

By means of a pixilation of the scintillator, a single channel processing can be realized with regards to the detection of neutrons with for example multi-anode photomultipliers.

The electronic processing of the channels can be arranged independently and relatively simply.

By the use of space saving, integrated components, the dimension of the electronics can be limited to the surface of the light readout unit.

A high space-resolution, high count rates and high detection efficiency (evidence efficiency) can be achieved at the same time, which cannot be reached with singe channel photomultipliers.

A detector can be made up of modules in order to generate a large-area detector. The advantageous properties are then scaled up corresponding to the area.

The scintillator may comprise a substrate or carrier, respectively, in shape of a glass pane, which is preferably continuous. In contrast thereto, pixels of the scintillator, for example formed from Li-glass, can be separated from each other and comprise, for the purpose of optical separation, interstices between the pixels that are filled with reflection material (e.g. barium sulfate).

Substrate and pixels are attached to each other in particular though an adhesive layer. A commercially available adhesive or gel is suitable for this.

An additional adhesive layer may be provided between the pixels and the photomultiplier or the light readout unit, respectively. It should have highest possible transparency for light.

The scintillation detector is in particular made for the detection of neutrons. Through the choice of materials of the scintillator, it can be configured also for the detection of other radiation, though.

In the following, the invention is described in detail based on an example embodiment.

It shows

Figure 2:
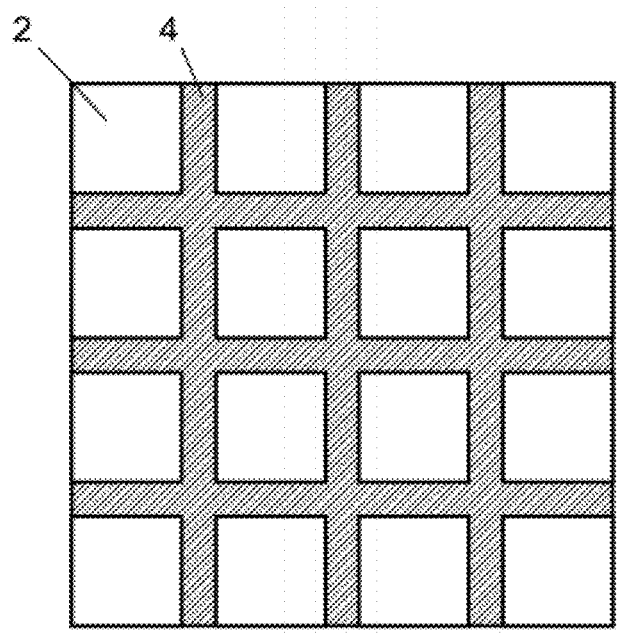

FIG. 1: Scintillation detector in a sectional view;

FIG. 2: Scintillator seen in top view;

FIG. 3: Scintillator with a carrier, whose index of refraction is bigger than the index of refraction of the scintillation material;

FIG. 4: Scintillator with a carrier, whose index of refraction is smaller than the index of refraction of the scintillation material;

FIG. 1 illustrates a scintillation detector according to the invention in a lateral sectional view.

The scintillation detector comprises a glass pane 1 as carrier for scintillation material, on which pixels 2 formed from Li-glass with an area of 6 mm×6 mm are attached by means of an adhesive layer 3. The pixels 2 formed from scintillation material have a distance respectively interstice between each other of 100 μm. The interstices between the pixels 2 are filled with barium sulfate. By means of an adhesive layer 5, a multi-anode photomultiplier 6 is attached to the pixels 2.

Through plug pins 7 of the multi-anode photomultiplier 6 and a frame 8, evaluation electronics 9 is downstream connected and connected to the multi-anode photomultiplier 6.

The carrier material, thus the glass pane 1, has a lower index of refraction than the scintillation material, thus the pixels 2, in order to avoid cross-talk in a further improved manner.

During operation, neutrons hit the scintillation detector according to the arrow display.

The behind the scintillator with the components 1, 2, 3, 4 arranged further components of the detector, thus the photomultiplier 6 as well as the evaluation electronics 9, are as shown in FIG. 1 laterally not protruding the scintillator in order to enable a modular structure in a suitable manner. In top view seen on the glass pane 1, the base surface of the evaluation electronics and the front surface of the multi-anode photomultiplier thus do not protrude the glass pane 1.

FIG. 2 shows the scintillator in a view seen on the pixels 2, which has an area (surface) of 6 mm×6 mm.

FIGS. 3 and 4 show each a scintillator with a pixel 2, in which a light flash has been generated due to an incident neutron. Starting from area 11, the light spreads according to the arrow display. In case of FIG. 3, the index of refraction of the carrier material 1 formed from glass is bigger than the index of refraction of the pixels 2. In case of FIG. 4, the index of refraction of the carrier material 1 formed from glass is smaller than the index of refraction of the pixels 2. In case of FIG. 3, an unwanted cross-talk may occur due to refraction and reflection. This is avoided in the case of FIG. 4.

When the index of refraction of the Li-glass 2 as shown in FIG. 3 is lower than the one of the carrier glass 1, the adhesive layer 3 then has no mentionable influence on the reflection property of the light.

In this case, by means of refraction, light that is emitted from the scintillation process in the Li-glass 2 in direction of the carrier glass 1 enters the neighboring pixels 2. Thereby, the pixel may cross-talk between each other, which leads to worse space-resolution as well as also to higher noise.

When the index of refraction of the Li-glass 2 as shown in FIG. 4 is higher than the one of the carrier glass 1, the adhesive layer 3 has then no mentionable influence on the reflection property of the light. In this case, as shown in FIG. 4, an inner total reflection takes place so that no cross-talk occurs between the pixels 2.

The adhesive 3 may however alternatively or additionally be chosen such that it absorbs and/or reflects backwards in direction of glass pane 1 scattered light. Hereby, cross-talk is prevented as well.

The invention claimed is:

1. Scintillation detector having a scintillator, a light readout unit mounted behind it, and evaluation electronics, so that the light readout unit is between the scintillator and the evaluation electronics, wherein the scintillator is formed from pixels formed from scintillation material, which are separated from each other by interstices, or whose surface is pixelated by grooves, wherein the pixels are up to 8 mm long and up to 8 mm wide, wherein the scintillator comprises a carrier for the scintillation material, which generates light flashes in response to incident radiation, and wherein the carrier material has a lower magnitude of a complex index of refraction than the scintillation material.

2. Scintillation detector according to claim 1, characterized in that at least one of the grooves and interstices are filled with reflection material for the light to be detected.

3. Scintillation detector according to claim 2, characterized in that the reflection material consists of barium sulfate.

4. Scintillation detector according to claim 1, characterized in that at least one of the distance between the pixels generated by the interstices amounts to at least 100 µm and the grooves are at least 100 µm wide.

5. Scintillation detector according to claim 1, characterized in that the pixels are at least one of up to 6 mm, preferably up to 3 mm long and up to 6 mm, preferably up to 3 mm wide and that the pixels are at least one of at least 3 mm long and at least 3 mm wide.

6. Scintillation detector according to claim 1, characterized in that the pixels contain 6Li.

7. Scintillation detector according to claim 1, wherein the scintillator comprises a substrate for the scintillation material, which generates light flashes in response to incident radiation, which has a lower index of refraction than the scintillation material.

8. Scintillation detector according to claim 1, wherein the scintillator comprises a substrate for the scintillation material, which generates light flashes in response to incident radiation, and wherein an adhesive layer that is at least one of light absorbing and light reflecting is installed between the substrate and the scintillation material.

9. Scintillation detector according to claim 1, characterized in at least one of that pixels of the light readout unit, in particular the anodes of a multi-anode photomultiplier, are at least one of up to 6 mm, preferably up to 3 mm, long and up to 6 mm, preferably up to 3 mm, wide and that the pixels of the light readout unit, in particular the anodes of a multi-anode photomultiplier, are at least one of at least 3 mm long and at least 3 mm wide.

10. Scintillation detector according to claim 1, characterized in that the base surface of the evaluation electronics does not exceed the size of the front surface of the light readout unit (multi-anode photomultiplier).

11. Scintillation detector according to claim 10, characterized in that the scintillation detector is formed from a multiplicity of modules.

12. Scintillation detector according to claim 1, characterized in that the evaluation electronics comprises one or more integrated electronic components, which conduct an amplification and noise filtering of the individual signals of the pixels of a light readout unit (multi-anode photomultiplier).

13. Scintillation detector according to claim 1, characterized in that the evaluation electronics comprises a programmable logic device with internal storage areas, which takes over a number of tasks, specifically in particular a setting of at least one of the measurement modes and the comparator thresholds of integrated electronic components as well as registration of logic comparator signals that are summed up in a chronological order in internal storage places, just like also of data of an analog-to-digital converter, which are also summed up in internal storages.

* * * * *